US005088574A

United States Patent [19]

[11] Patent Number: 5,088,574

[45] Date of Patent: Feb. 18, 1992

Kertesz, III

[54] CEILING SPEAKER SYSTEM

[76] Inventor: Emery Kertesz, III, Fatima La., Box 374, Ottsville, Pa. 18942

[21] Appl. No.: 509,663

[22] Filed: Apr. 16, 1990

[51] Int. Cl.⁵ ...... H05K 5/00

[52] U.S. Cl. ...... 181/150; 181/154; 381/50

[58] Field of Search ...... 181/144, 147, 150, 154, 181/171, 199; 381/24, 90

[56] References Cited

U.S. PATENT DOCUMENTS

| | | | |
|---|---|---|---|
| 1,866,831 | 7/1932 | Wolff et al. | 181/147 |
| 3,379,276 | 4/1968 | Goettl | 181/154 X |
| 3,578,103 | 5/1971 | Lennes | 181/156 |
| 3,608,665 | 9/1971 | Drisi | 181/180 |

*Primary Examiner*—Brian W. Brown

*Attorney, Agent, or Firm*—Caesar, Rivise, Bernstein, Cohen & Pokotilow, Ltd.

[57] ABSTRACT

A compact ceiling mounted loudspeaker system comprising a truncated pyramidal shaped housing supporting an array of four coaxial 2-way loudspeakers. Each loudspeaker is mounted on a respective face of the pyramidal housing so that none faces directly downward. The angles at which the loudspeakers are mounted with respect to the vertical axis and with respect to one another enables the array to produce a flat frequency response hemispherically into the space below the ceiling, with good sound dispersion therein, and with minimal phase cancellation and diffraction effects among said loudspeakers. The speaker system is arranged to be disposed on the grid of a conventional suspended ceiling system to create a space between the suspended ceiling and the surface from which the suspended ceiling is hung to create an infinite baffle to augment the sound produced by the speaker system.

22 Claims, 1 Drawing Sheet

FIG. 1
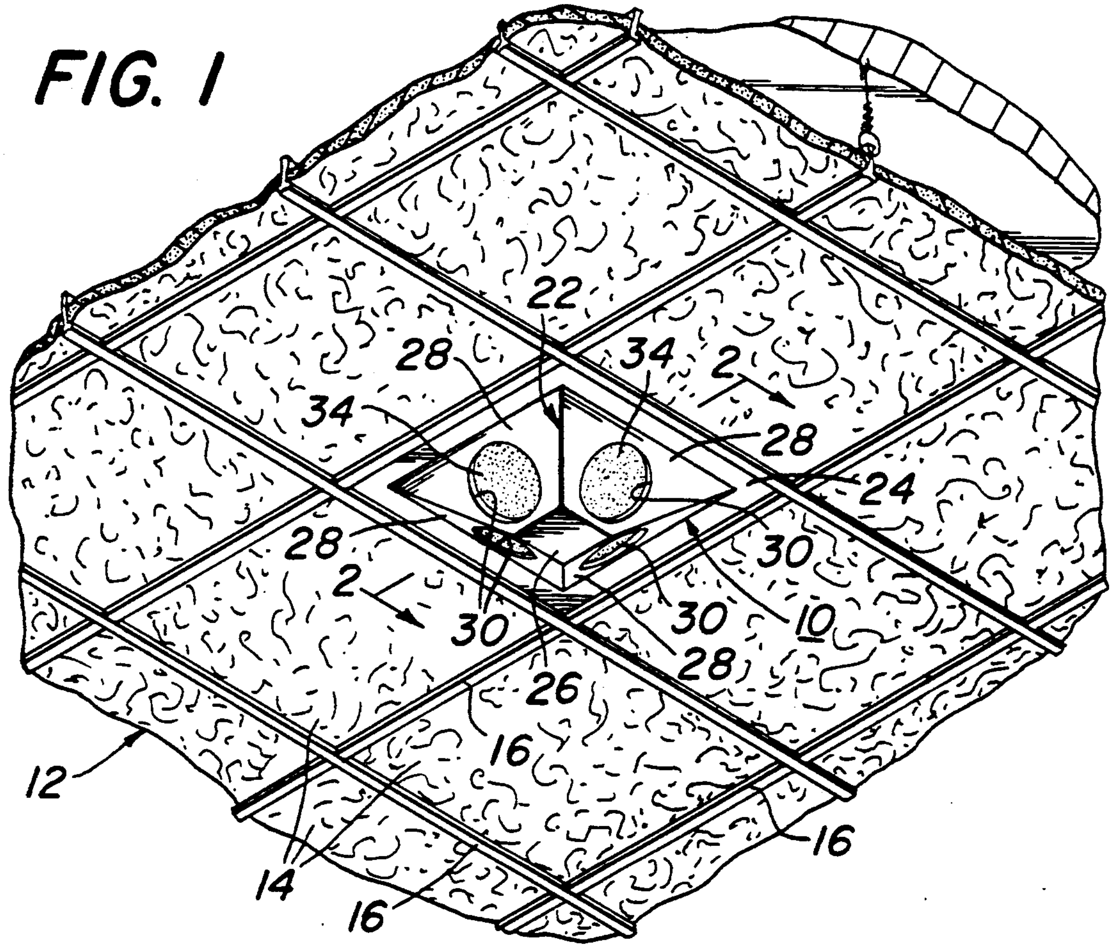
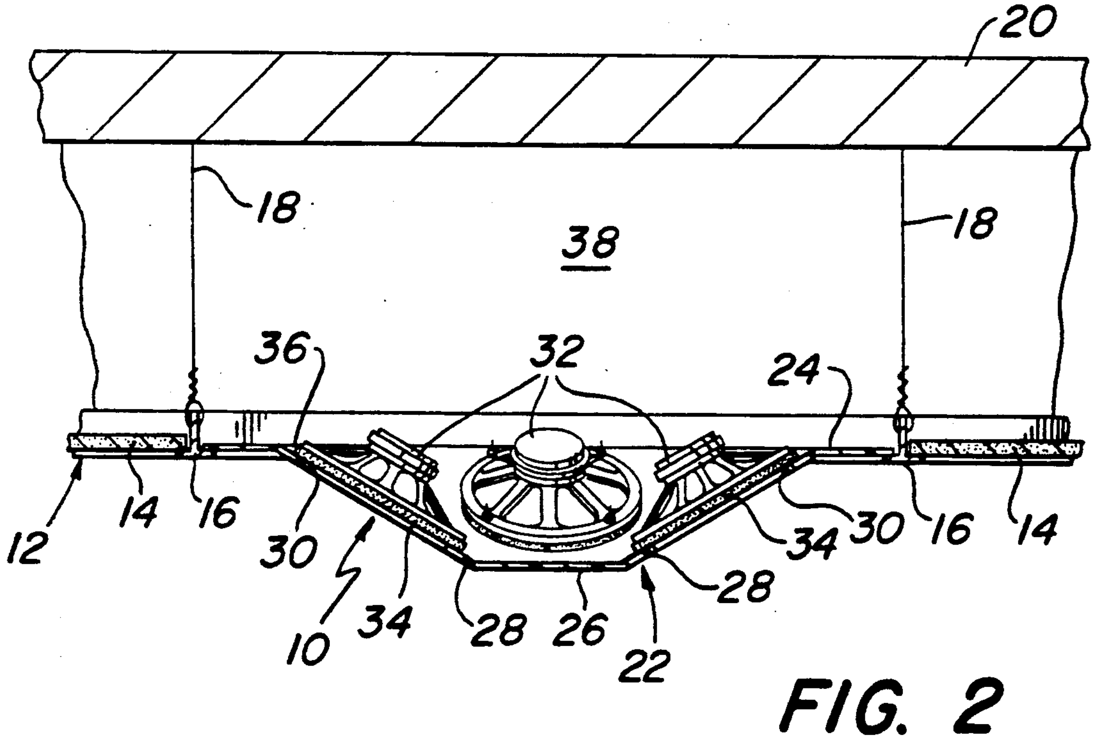
FIG. 2

CEILING SPEAKER SYSTEM

BACKGROUND OF THE INVENTION

This invention relates generally to loudspeaker systems and more particularly to loudspeaker systems for ceiling mounting applications.

In the prior art various loudspeakers have been disclosed and are commercially available for mounting in a ceiling. Such speakers tend to produce a flat frequency response and good dispersion only within a very confined field, e.g., ninety degrees off axis. Thus, prior art ceiling speakers are known to produce less than optimal sound throughout the room in which they are mounted and this is primarily due to the fact that conventional ceiling speakers are mounted so that they face directly downward. Moreover, due to their direct downward orientation conventional ceiling speakers are subject to reflections off the floor back to the ceiling, which frequently results in echo sound and concomitant uncomfortable acoustic conditions for the listener. Further still, prior art ceiling speakers are typically mounted behind a perforated metal cover, which tends to degrade the sound due to turbulence, interference and/or reflection.

OBJECTS OF THE INVENTION

Accordingly, it is a general object of this invention to provide a ceiling speaker system which overcomes the disadvantages of the prior art.

It is a further object of this invention to provide a ceiling speaker system which produces a flat response hemispherically (180 degrees vertically and 360 degrees horizontally) into the room.

It is still a further object of this invention to provide a ceiling speaker system which produces an omni-directional dispersion pattern into the room.

It is yet a further object of this invention to provide a speaker system that can be readily mounted in a conventional suspended ceiling.

SUMMARY OF THE INVENTION

These and other objects of this invention are achieved by providing a speaker system for mounting in a ceiling e.g., a conventional suspended ceiling system. The speaker system comprises mounting means and an array of acoustic driver means, e.g., four or more 2-way coaxial loudspeakers. The mounting means has a plurality of mounting surfaces, e.g., side walls of a truncated pyramid, each of which mounts a respective one of the acoustic driver means thereon at a first predetermined acute angle, e.g., 30 degrees, to the vertical axis and at a second predetermined angle, e.g., 90 degrees, to each immediately adjacent acoustic driver means. The angles of mounting of the array of acoustic driver means produces a flat frequency response hemispherically into the space below the ceiling, with good sound dispersion therein, and with minimal phase cancellation and diffraction effects among the acoustic driver means.

DESCRIPTION OF THE DRAWINGS

Other objects and many of the attendant advantages of this invention will be readily appreciated as the same becomes better understood by reference to the following detailed description when considered in connection with the accompanying drawings wherein:

FIG. 1 is an isometric view showing a conventional suspended ceiling in which is mounted a speaker system constructed in accordance with this invention; and FIG. 2 is an enlarged sectional view taken along line 2—2 of FIG. 1.

DETAILED DESCRIPTION OF THE PREFERRED EMBODIMENTS

Referring now in greater detail to the various figures of the drawings wherein like reference characters refer to like parts there is shown at 10 in FIG. 1 a speaker system embodying the present invention, being mounted within a conventional suspended ceiling system 12.

Referring to FIGS. 1 and 2 the ceiling system 12 in which the speaker system 10 of this invention is mounted includes a plurality of tiles 14 removably supported on an array of supporting grids 16, said grids being attached to hanger wires 18 suspended from an upper ceiling 20 in a conventional manner.

In accordance with a preferred embodiment of this invention the speaker system 10 is easily installed by merely replacing one of the tiles 14 with the speaker system. In this regard, the speaker system 10 includes mounting means 22 is made from a suitable plastic material, such as polystyrene, and is in the form or shape of a truncated pyramid. In a preferred embodiment of the invention the mounting means 22 includes a generally horizontally disposed peripheral flange section 24 at the upstream end thereof and a generally flat base section 26 at the downstream end thereof. Four sloping sidewalls 28 interconnect the peripheral flange 24 and the flat base 26. Each sloping sidewall has a passage 30 therethrough, and an acoustic driver means 32, e.g., a two-way co-axial speaker, is secured to each sidewall 28 in alignment with a corresponding passage 30.

In the preferred embodiment of this invention an acoustical foam layer 34, such as a polyurethane foam sold under the trademark SCOTTFOAM, is employed as a covering for each of the speakers. This type of covering actually is acoustically transparent, and thereby will not tend to degrade the sound emanating from the speaker, due to turbulence, interference and/or reflection of the type encountered with perforated metal covers.

In the most preferred embodiment of this invention the speakers 32 are disposed at a first predetermined acute angle of approximately 30 degrees to the vertical axis, and at a second predetermined angle of approximately 90 degrees to each immediately adjacent speaker. The angles of mounting of the acoustic driver means 32 and their angles relative to each other and to the vertical axis are chosen to produce a flat frequency response hemispherically into the space below the ceiling, with good sound dispersion therein and with minimal phase cancellation and diffraction effects among the acoustic driver means.

In a representative embodiment of this invention the mounting means 22 is approximately two feet (61 cm) by two feet (61 cm) square at the upstream end thereof, and approximately four inches (10.2 cm) high.

As can be seen best in FIG. 2 the mounting means 22 has an opened passage 36 at the upstream end thereof to communicate each of the speakers 32 with a space 38 disposed between the ceiling support grids 16 and ceiling 20. This space 38 constitutes an infinite baffle to reenforce the sound from the speakers, thereby further enhancing the quality of sound reproduction.

Without further elaboration the foregoing will so fully illustrate our invention that others may, by applying current or future knowledge, adopt the same for use under various conditions of service.

I claim:

1. A speaker system for mounting on a ceiling, said system comprising mounting means of pyramidal shape for mounting said system on said ceiling and an array of acoustic driver means for broadcasting sound, said mounting means having a plurality of mounting surfaces connected together to form said pyramidal shape, said mounting means also including a flange that is secured against said ceiling, said mounting means being connected to at least one of mounting surfaces, each of said surfaces mounting a respective one of said acoustic driver means thereon at a first predetermined acute angle to the vertical axis and at a second predetermined angle to each immediately adjacent acoustic driver means, said angles of mounting of said array of acoustic drivers producing a flat frequency response hemispherically into the space below the ceiling with good sound dispersion therein radiating said sound outwardly and downwardly in multiple directions, and with minimal phase cancellation and diffraction effects among said acoustic driver means.

2. The speaker system of claim 1 wherein said mounting means is of a truncated pyramid shape.

3. The speaker system of claim 1 wherein said first predetermined angle is approximately 30 degrees.

4. The speaker system of claim 2 wherein said first predetermined angle is approximately 30 degrees.

5. The speaker system of claim 1 wherein said mounting means is arranged to be mounted at said ceiling but open to a space above said ceiling, said acoustic drivers being in communication with aid space, whereupon said space forms an infinite baffle for said speaker system.

6. The speaker system of claim 1 wherein said mounting means is arranged to be mounted at a suspended ceiling system which comprises a grid, and wherein said mounting means of said speaker system comprises a horizontal flange portion of generally square outer periphery for disposition on portions of said grid.

7. The speaker system of claim 6 wherein said mounting means additionally comprises a portion a truncated pyramid shape from which said flange portion projects.

8. The speaker system of claim 7 wherein said first predetermined angle is approximately 30 degrees.

9. The speaker system of claim 8 wherein said mounting means is approximately 2 feet (61 cm) by 2 feet (61 cm) square and by 4 inches (10.2 cm) high.

10. The speaker system of claim 1 wherein said mounting means comprises a horizontal portion of generally square outer periphery.

11. The speaker system of claim 10 wherein said mounting means additionally comprises a portion of a truncated pyramid shape from which said flange portion projects.

12. The speaker system of claim 10 wherein said ceiling comprises a grid, and wherein said mounting means of said speaker system comprises a horizontal flange portion of generally square outer periphery for disposition on portions of said grid.

13. The speaker system of claim 12 wherein said first predetermined angle is approximately 30 degrees.

14. The speaker system of claim 13 wherein said mounting means is approximately 2 feet (61 cm) by 2 feet (61 cm) square and by 4 inches (10.2 cm) high.

15. The speaker system of claim 1 additionally comprising acoustically transparent foam disposed over said acoustic driver means.

16. The speaker system of claim 7 additionally comprising acoustically transparent foam disposed over said acoustic driver means.

17. The speaker system of claim 11 additionally comprising acoustically transparent foam disposed over said acoustic driver means.

18. The speaker system of claim 1 wherein each of said acoustic driver means comprises a coaxial two-way loudspeaker.

19. The speaker system of claim 12 wherein each of said acoustic driver means comprises a coaxial two-way loudspeaker.

20. The speaker system of claim 16 wherein each of said acoustic driver means comprises a coaxial two-way loudspeaker.

21. The speaker system of claim 17 wherein each of said acoustic driver means comprises a coaxial two-way loudspeaker.

22. The speaker system of claim 1 wherein said flange lies flush with said ceiling.

* * * * *